United States Patent
Ebe et al.

(10) Patent No.: US 9,357,645 B2
(45) Date of Patent: May 31, 2016

(54) JOINING SHEET, ELECTRONIC COMPONENT, AND PRODUCING METHOD THEREOF

(71) Applicant: NITTO DENKO CORPORATION, Osaka (JP)

(72) Inventors: Hirofumi Ebe, Osaka (JP); Yoshihiro Furukawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 414 days.

(21) Appl. No.: 13/804,376

(22) Filed: Mar. 14, 2013

(65) Prior Publication Data

US 2013/0258632 A1    Oct. 3, 2013

(30) Foreign Application Priority Data

Mar. 27, 2012 (JP) .................. 2012-072147

(51) Int. Cl.
| | |
|---|---|
| *H05K 1/09* | (2006.01) |
| *H05K 3/32* | (2006.01) |
| *H05K 3/36* | (2006.01) |
| *B23K 35/24* | (2006.01) |
| *H05K 1/11* | (2006.01) |
| *H05K 13/04* | (2006.01) |

(52) U.S. Cl.
CPC ................ *H05K 1/092* (2013.01); *B23K 35/24* (2013.01); *H05K 1/11* (2013.01); *H05K 3/323* (2013.01); *H05K 3/368* (2013.01); *H05K 13/04* (2013.01); *H05K 2201/0129* (2013.01); *H05K 2201/10977* (2013.01); *Y10T 428/31529* (2015.04); *Y10T 428/31678* (2015.04)

(58) Field of Classification Search
CPC ....... H05K 1/092; H05K 1/095; H05K 1/097; H05K 3/386; H05K 3/323
See application file for complete search history.

(56) References Cited

U.S. PATENT DOCUMENTS

| | | | | |
|---|---|---|---|---|
| 5,509,815 | A | * | 4/1996 | Jin et al. .......................... 439/91 |
| 5,858,605 | A | * | 1/1999 | Sinta et al. ..................... 430/192 |
| 6,172,878 | B1 | * | 1/2001 | Takabayashi et al. ........ 361/760 |
| 6,583,834 | B1 | | 6/2003 | Uchiyama |
| 8,796,557 | B2 | * | 8/2014 | Ishimatsu et al. ............. 174/259 |
| 2006/0043597 | A1 | | 3/2006 | Wada et al. |
| 2007/0216023 | A1 | | 9/2007 | Nakatani et al. |

(Continued)

FOREIGN PATENT DOCUMENTS

| | | |
|---|---|---|
| CN | 101014442 A | 8/2007 |
| CN | 101755022 A | 6/2010 |

(Continued)

OTHER PUBLICATIONS

Article 94(3) EPC Communication issued by EPO on Sep. 8, 2014 in connection with corresponding European Patent Appln. No. 13161298.8.

(Continued)

*Primary Examiner* — Jeremy C Norris
(74) *Attorney, Agent, or Firm* — Jean C. Edwards, Esq.; Edwards Neils PLLC (57) ABSTRACT

A joining sheet includes a solder layer which contains solder particles, a thermoplastic resin, and an active agent capable of activating the solder particles and a thermosetting resin-containing layer which is laminated on at least one surface in a thickness direction of the solder layer and contains a thermosetting resin.

10 Claims, 1 Drawing Sheet

(56) References Cited

U.S. PATENT DOCUMENTS

| | | |
|---|---|---|
| 2009/0203170 A1 | 8/2009 | Nakatani et al. |
| 2010/0096175 A1 | 4/2010 | Ishimatsu et al. |
| 2010/0221559 A1* | 9/2010 | Konno et al. .......... 428/457 |
| 2012/0156502 A1 | 6/2012 | Maejima et al. |

FOREIGN PATENT DOCUMENTS

| | | |
|---|---|---|
| JP | 39-29084 | 12/1964 |
| JP | 50-92249 | 7/1975 |
| JP | 62-127194 | 6/1987 |
| JP | 63-254792 | 10/1988 |
| JP | 03-184694 | 8/1991 |
| JP | 2006-150413 A | 6/2006 |
| JP | 2006-199937 A | 8/2006 |
| JP | 2011-020157 | 2/2011 |
| JP | 2011-066312 A | 3/2011 |

OTHER PUBLICATIONS

Office Action issued by SIPO on Sep. 1, 2015 in connection with Chinese Patent Application No. 201310102410.2.

Notification of Reasons for Refusal issued by the Japanese Patent Office on Oct. 13, 2015 in connection with Japanese Patent Application No. 2012-072147.

Extended European Search Report issued by the European Patent Office (EPO) on Jun. 26, 2013, in connection with European Patent Application No. 13161298.8-1806.

* cited by examiner

JOINING SHEET, ELECTRONIC COMPONENT, AND PRODUCING METHOD THEREOF

CROSS-REFERENCE TO RELATED APPLICATION

The present application claims priority from Japanese Patent Application No. 2012-072147 filed on Mar. 27, 2012, the contents of which are hereby incorporated by reference into this application.

BACKGROUND OF THE INVENTION

1. Field of the Invention

The present invention relates to a joining sheet, an electronic component, and a producing method thereof, to be specific, to a joining sheet, a method for producing an electronic component using the joining sheet, and an electronic component obtained by the method.

2. Description of Related Art

Conventionally, it has been known that a solder paste which contains solder particles made of tin-bismuth based solder or the like and an active agent such as a carboxylic acid is used in the joining of terminals of two pieces of wired circuit boards. The tin-bismuth based solder particles are capable of being melted at low temperature. However, a solder joining portion which is formed by heating the tin-bismuth based solder particles to be melted has a low shock resistance and a low joining reliability. Therefore, in order to improve these properties, a solder paste which contains a thermosetting resin such as an epoxy resin in addition to the above-described solder paste has been proposed (ref: for example, Japanese Unexamined Patent Publication No. 2006-150413).

In Japanese Unexamined Patent Publication No. 2006-150413, the solder paste is applied to the surface of a terminal by a screen printing or the like and next, another terminal is brought into contact with the solder paste to be then heated. In this way, the solder particles are easily melted by the active agent, and the solder joining portion which is formed of the solder particles and a resin layer which is formed around the solder joining portion and reinforces the solder joining portion by allowing the thermosetting resin to cure are formed, so that the two terminals are solder joined.

SUMMARY OF THE INVENTION

However, in Japanese Unexamined Patent Publication No. 2006-150413, there may be a case where the thermosetting resin reacts with the active agent before heating or during heating, so that the active agent is deactivated. As a result, there is a disadvantage that the melting of the solder particles becomes insufficient at the time of heating, so that the solder joining portion is not capable of being formed and therefore, the reliability of the electronic component to be obtained is reduced.

Also, in recent years, with the miniaturization of a terminal of an electronic component, there is a disadvantage that when printing is performed using the solder paste in Japanese Unexamined Patent Publication No. 2006-150413, the technology for miniaturization of printing is required and an industrial burden becomes heavy.

It is an object of the present invention to provide a joining sheet in which solder melting is excellent and which has an excellent joining strength and is capable of easily solder joining, an electronic component, and a method for producing thereof.

A joining sheet of the present invention includes a solder layer which contains solder particles, a thermoplastic resin, and an active agent capable of activating the solder particles and a thermosetting resin-containing layer which is laminated on at least one surface in a thickness direction of the solder layer and contains a thermosetting resin.

In the joining sheet of the present invention, it is preferable that the thermosetting resin-containing layer further contains a thermoplastic resin and the content ratio of the thermosetting resin with respect to the thermosetting resin-containing layer is above 10 volume % and below 47.5 volume %.

In the joining sheet of the present invention, it is preferable that the content ratio of the solder particles with respect to the solder layer is above 40 volume % and below 90 volume %.

In the joining sheet of the present invention, it is preferable that the active agent is a carboxylic acid.

In the joining sheet of the present invention, it is preferable that the thermosetting resin contains an epoxy resin.

In the joining sheet of the present invention, it is preferable that the solder particles are made of a tin-bismuth alloy.

In the joining sheet of the present invention, it is preferable that the thermosetting resin-containing layer further contains a curing agent and a curing accelerator.

In the joining sheet of the present invention, it is preferable that the thermosetting resin-containing layer is also laminated on the other surface in the thickness direction of the solder layer.

A method for producing an electronic component of the present invention includes the steps of preparing a laminate in which a joining sheet is disposed between two pieces of wired circuit boards arranged so that corresponding terminals thereof are spaced in opposed relation to each other and heating the laminate at a temperature that is not less than the melting point of solder particles.

An electronic component of the present invention is obtained by the above-described method for producing an electronic component.

The joining sheet of the present invention includes the solder layer which contains the solder particles, the thermoplastic resin, and the active agent and the thermosetting resin-containing layer which contains the thermosetting resin. That is, the active agent and the thermosetting resin are contained in separate layers. Therefore, the deactivation of the active agent due to the reaction thereof can be suppressed and the melting (the solder melting) of the solder particles is excellent, so that the solder joining portion made of a solder material can be surely formed.

The solder joining portion can be reinforced by a cured layer in which the thermosetting resin is cured, so that the joining strength can be improved.

In the method for producing an electronic component of the present invention, the above-described joining sheet is disposed between the two pieces of wired circuit boards to prepare the laminate. Thereafter, the laminate is heated. Therefore, the two pieces of wired circuit boards can be easily joined by the joining sheet without using a highly-advanced printing technology and the excellent solder melting is possible, so that the solder joining portion which electrically connects the terminals can be surely formed.

The electronic component of the present invention has an excellent joining strength.

BRIEF DESCRIPTION OF THE DRAWINGS

FIG. 1 shows process drawings for illustrating one embodiment of a method for producing an electronic component of the present invention:

FIG. 1 (*a*) illustrating a step of preparing a joining sheet and wired circuit boards, FIG. 1 (*b*) illustrating a step of laminating the joining sheet and the wired circuit boards, FIG. 1 (*c*) illustrating a step of compressively bonding the joining sheet to the wired circuit boards, and FIG. 1 (*d*) illustrating a step of solder joining the joining sheet to the wired circuit boards.

DETAILED DESCRIPTION OF THE INVENTION

A joining sheet of the present invention includes a solder layer and a thermosetting resin-containing layer which is laminated on at least one surface in the thickness direction of the solder layer.

The solder layer is formed from a solder composition into a sheet shape. The solder composition contains solder particles, a thermoplastic resin, and an active agent which is capable of activating the solder particles.

The solder particles are dispersed in the thermoplastic resin. An example of a solder material which forms the solder particles includes, for example, in view of environmental acceptability, a solder material which does not contain lead (a lead-free solder material). To be specific, an example thereof includes a tin alloy such as a tin-bismuth alloy (Sn—Bi) and a tin-silver-copper alloy (Sn—Ag—Cu). In view of low temperature joining, preferably, a tin-bismuth alloy is used.

The content ratio of the tin in the tin-bismuth alloy is, for example, 10 to 50 mass %, or preferably 25 to 45 mass % and the content ratio of the bismuth therein is, for example, 50 to 90 mass %, or preferably 55 to 75 mass %.

The melting point of the solder material (the melting point of the solder particles) is, for example, 240° C. or less, or preferably 200° C. or less, and is, for example, 100° C. or more, or preferably 130° C. or more. The melting point of the solder material can be obtained by a differential scanning calorimetry (DSC).

The shape of each of the solder particles is not particularly limited and examples of the shape thereof include a sphere shape, a plate shape, and a needle shape. Preferably, a sphere shape is used.

The average value of the maximum length (in the case of a sphere shape, the average particle size) of each of the solder particles is, for example, 10 to 50 μm, or preferably 20 to 40 μm. When the average value of the maximum length of each of the solder particles is below the above-described range, there may be a case where the solder particles do not easily come into contact with each other at the time of heating and melting and the insoluble residue is left. On the other hand, when the average value of the maximum length of each of the solder particles is above the above-described range, the thinning of the joining sheet may be difficult.

The average value of the maximum length is measured using a laser diffraction scattering particle size analyzer.

Generally, the surface of each of the solder particles is covered with an oxide film made of an oxide of the solder material. The thickness of the oxide film is, for example, 1 to 20 nm.

The content ratio of the solder particles with respect to the solder composition (that is, the solder layer) is, for example, above 40 volume % and below 90 volume %, or preferably not less than 50 volume % and not more than 80 volume %. When the content ratio thereof is below the above-described range, there may be a case where the solder particles cannot come into contact with each other at the time of melting and therefore, cannot aggregate. On the other hand, when the content ratio thereof is above the above-described range, there may be a case where the filling of the solder layer with the solder particles is difficult, so that the processing of the solder composition into the solder layer in a sheet shape becomes difficult.

These solder particles can be used alone or in combination of two or more.

Examples of the thermoplastic resin include polyolefin (for example, polyethylene, polypropylene, and an ethylene-propylene copolymer), an acrylic resin, polyester, polyvinyl acetate, an ethylene-vinyl acetate copolymer, polyvinyl chloride, polystyrene, polyacrylonitrile, polyamide (nylon (trade mark)), polycarbonate, polyacetal, polyethylene terephthalate, polyphenylene oxide, polyphenylene sulfide, polysulfone, polyether sulfone, poly ether ether ketone, polyallyl sulfone, thermoplastic polyimide, thermoplastic polyurethane, polyamino-bismaleimide, polyamide-imide, polyether-imide, a bismaleimide-triazine resin, polymethylpentene, a fluorine resin, a liquid crystal polymer, an olefin-vinyl alcohol copolymer, ionomer, polyarylate, an acrylonitrile-ethylene-styrene copolymer, an acrylonitrile-butadiene-styrene copolymer, an acrylonitrile-styrene copolymer, and a butadiene-styrene copolymer.

As the thermoplastic resin, preferably, an acrylic resin and polyester are used, or more preferably, an acrylic resin is used.

The acrylic resin is made of an acrylic polymer. The acrylic polymer is a polymer of a monomer which contains, as a main component, an alkyl(meth)acrylate containing an alkyl portion having 1 to 12 carbon atoms such as methyl(meth)acrylate, ethyl(meth)acrylate, propyl(meth)acrylate, butyl(meth)acrylate, hexyl(meth)acrylate, octyl(meth)acrylate, decyl(meth)acrylate, and dodecyl(meth)acrylate. These monomers can be used alone or in combination.

A commercially available product can be used as the acrylic polymer. To be specific, examples thereof include LA polymer (manufactured by KURARAY CO., LTD.), SG-700AS (manufactured by Nagase ChemteX Corporation), and UC-3510 (manufactured by TOAGOSEI CO., LTD.).

The softening temperature of the thermoplastic resin is, for example, 80 to 140° C., or preferably 100 to 130° C.

These thermoplastic resins can be used alone or in combination of two or more.

The content ratio of the thermoplastic resin with respect to the solder composition (that is, the solder layer) is, for example, above 10 volume % and below 60 volume %, or preferably not less than 20 volume % and not more than 50 volume %.

The active agent is a compound which is capable of activating the solder particles at the time of solder melting in which the solder particles are melted by heating. The active agent is not particularly limited as long as it is, for example, a compound which is capable of removing the oxide films which are present at the surfaces of the solder particles at the time of solder melting. Examples thereof include a carboxylic acid, amine, and amine salt. Preferably, a carboxylic acid or the like is used.

An example of the carboxylic acid includes an aromatic carboxylic acid such as an aromatic monocarboxylic acid including a 2-phenoxybenzoic acid and an aromatic dicarboxylic acid including a phthalic acid. Also, an example of the carboxylic acid includes an aliphatic carboxylic acid such as an aliphatic monocarboxylic acid including a propionic acid, a myristic acid, and a palmitic acid and an aliphatic dicarboxylic acid including a sebacic acid, an adipic acid, and a suberic acid. Preferably, an aromatic carboxylic acid is used, or more preferably, an aromatic monocarboxylic acid is used.

Examples of the amine include methylamine, ethylamine, diethylamine, triethylamine, and triethanolamine.

An example of the amine salt includes diphenylguanidine hydrobromate.

The content ratio of the active agent with respect to 100 parts by mass of the solder particles is, for example, 0.05 to 10 parts by mass, or preferably 0.1 to 5 parts by mass.

The active agent removes the oxide films on the surfaces of the solder particles by being contained in the solder layer and can melt the solder particles at the melting point of the solder material.

In addition to the above-described component, for example, in view of improving adhesive strength of the solder particles to the thermoplastic resin, the solder composition can contain an additive such as a silane coupling agent at an appropriate proportion as required.

On the other hand, preferably, the solder composition does not substantially contain the thermosetting resin. That is, the solder composition consists only of the solder particles, the thermoplastic resin, and the active agent (and the additive contained therein if necessary). In this way, the deactivation of the active agent due to the reaction, which may occur if the active agent (to be specific, a carboxylic acid or the like) and the thermosetting resin (to be specific, an epoxy resin to be described later or the like) are present in the same layer (the solder layer), can be suppressed. And therefore, it becomes possible to perform an excellent solder melting by the active agent. A case where the solder composition does not substantially contain the thermosetting resin is defined as follows: the content ratio of the thermosetting resin with respect to the solder composition of, for example, 5 volume % or less, preferably below 1 volume %, or more preferably below 0.5 volume %. An example of the thermosetting resin includes a thermosetting resin to be described later in the thermosetting resin-containing layer.

The thermosetting resin-containing layer is formed on both surfaces (one surface and the other surface in the thickness direction) or on one surface (one surface in the thickness direction) of the solder layer. The thermosetting resin-containing layer is formed from a thermosetting resin composition containing a thermosetting resin into a sheet shape.

Examples of the thermosetting resin include an epoxy resin, a urea resin, a melamine resin, a diallyl phthalate resin, a silicone resin, a phenol resin, a thermosetting acrylic resin, thermosetting polyester, thermosetting polyimide, and thermosetting polyurethane. Preferably, an epoxy resin and thermosetting polyurethane are used, or particularly preferably, an epoxy resin is used.

Examples of the epoxy resin include an aromatic epoxy resin such as a bisphenol epoxy resin (for example, a bisphenol A epoxy resin, a bisphenol F epoxy resin, a bisphenol S epoxy resin, a hydrogenated bisphenol A epoxy resin, a dimer acid-modified bisphenol epoxy resin, and the like), a novolak epoxy resin (for example, a phenol novolak epoxy resin, a cresol novolak epoxy resin, a biphenyl epoxy resin, and the like), a naphthalene epoxy resin, a fluorene epoxy resin (for example, a bisaryl fluorene epoxy resin and the like), and a triphenylmethane epoxy resin (for example, a trishydroxyphenylmethane epoxy resin and the like); a nitrogen-containing-cyclic epoxy resin such as triepoxypropyl isocyanurate (triglycidyl isocyanurate) and a hydantoin epoxy resin; an aliphatic epoxy resin; an alicyclic epoxy resin (for example, a dicyclo ring-type epoxy resin and the like); a glycidylether epoxy resin; and a glycidylamine epoxy resin.

As the epoxy resin, preferably, an aromatic epoxy resin is used, more preferably, a bisphenol epoxy resin is used, or particularly preferably, a bisphenol F epoxy resin is used.

A commercially available product can be used as the epoxy resin. To be specific, YSLV-80XY (a bisphenol F epoxy resin, manufactured by NIPPON STEEL CHEMICAL CO., LTD.) or the like is used.

These thermosetting resins can be used alone or in combination of two or more.

The curing temperature at which the thermosetting resin starts curing is appropriately set in accordance with the type of a curing agent or the like to be described next and is, for example, 100 to 200° C., or preferably 150 to 180° C.

Figures 1, 1A, 1D:
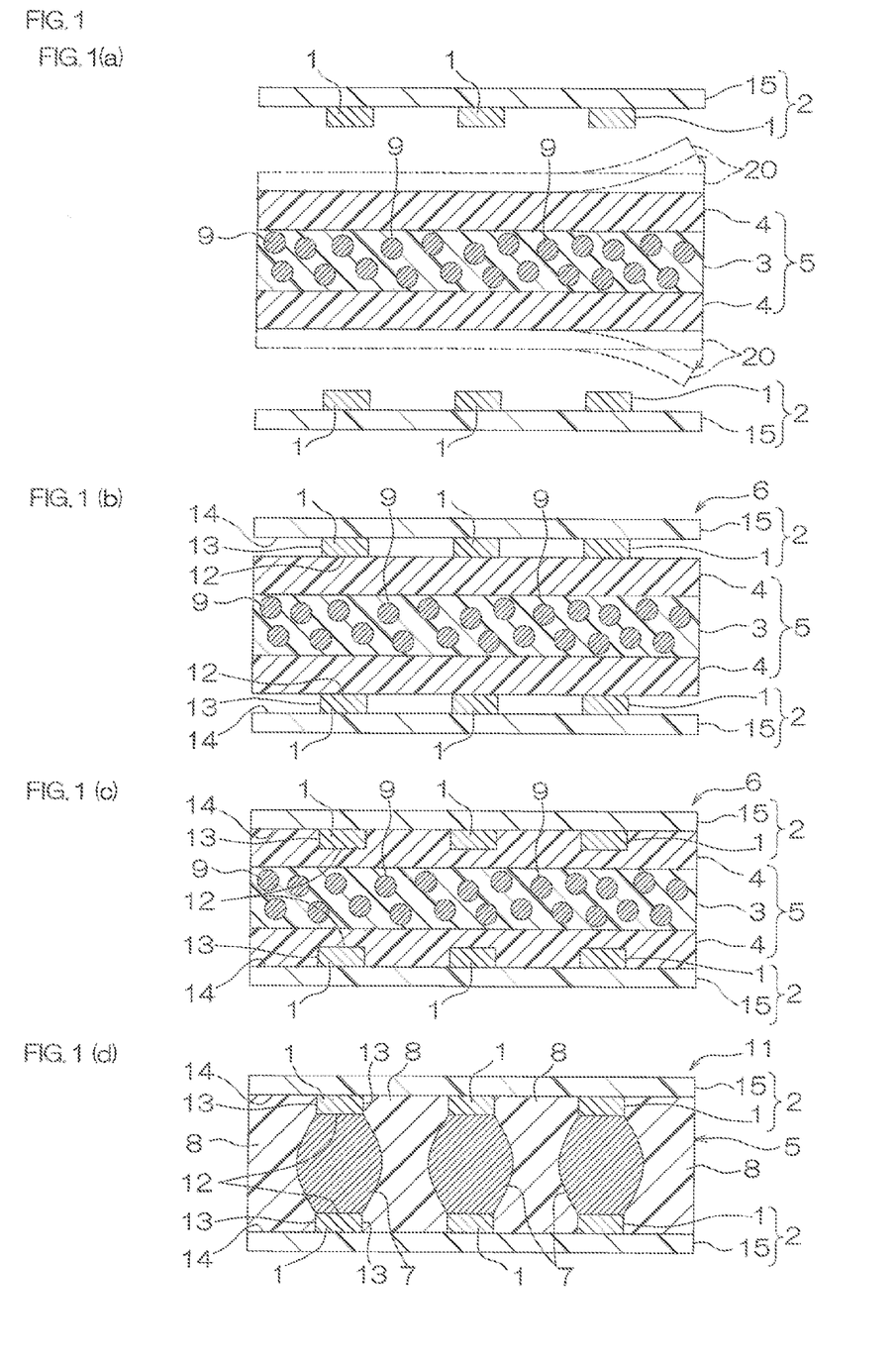

The content ratio of the thermosetting resin with respect to the thermosetting resin composition (that is, the thermosetting resin-containing layer) is, for example, above 10 volume % and below 47.5 volume %, or preferably not less than 15 volume % and not more than 45 volume %. When the content ratio thereof is below the above-described range, a sufficient reinforcing effect with respect to solder joining portions 7 (described later, ref: FIG. 1 (d)) after the solder joining may not be obtained. On the other hand, when the content ratio thereof is above the above-described range, it may be difficult to form the thermosetting resin composition into the thermosetting resin-containing layer in a sheet shape.

The thermosetting resin composition can further contain a curing agent and a curing accelerator.

The curing agent is appropriately determined in accordance with the type of the thermosetting resin or the like. Examples thereof include a phenol resin, amines, and thiols. Preferably, a phenol resin is used.

Examples of the phenol resin include a novolak phenol resin obtained by condensing phenol and formaldehyde under an acidic catalyst and a phenol-aralkyl resin obtained by synthesizing phenol and dimethoxyparaxylene or bis(methoxymethyl)biphenyl.

Preferably, a phenol-aralkyl resin is used. A commercially available product can be used as the phenol-aralkyl resin. To be specific, MEH-7851SS, MEHC-7800H (the description above, manufactured by MEIWA PLASTIC INDUSTRIES, LTD.), and the like are used.

The content ratio of the curing agent with respect to the thermosetting resin composition is, for example, above 10 volume % and below 47.5 volume %, or preferably not less than 15 volume % and not more than 45 volume %. The content ratio of the curing agent with respect to 100 parts by volume of the thermosetting resin is, for example, 10 to 200 parts by volume, or preferably 50 to 150 parts by volume.

Examples of the curing accelerator include an imidazole compound, an imidazoline compound, an organic phosphine compound, an acid anhydride compound, an amide compound, a hydrazide compound, and a urea compound. Preferably, an imidazole compound is used.

Examples of the imidazole compound include 2-phenyl imidazole, 2-methyl imidazole, 2-ethyl-4-methyl imidazole, 2-phenyl-4-methyl imidazole, and 2-phenyl-4-methyl-5-hydroxymethyl imidazole.

The content ratio of the curing accelerator with respect to 100 parts by mass of the thermosetting resin is, for example, 0.5 to 20 parts by mass, or preferably 1 to 10 parts by mass.

Preferably, the thermosetting resin composition further contains a thermoplastic resin. An example of the thermoplastic resin includes the same thermoplastic resin as that illustrated in the solder layer.

The content ratio of the thermoplastic resin with respect to the thermosetting resin composition is, for example, above 5 volume % and below 80 volume %, or preferably not less than 10 volume % and not more than 70 volume %.

The thermosetting resin composition can contain an additive as required.

On the other hand, preferably, the thermosetting resin composition does not substantially contain the active agent. That is, the thermosetting resin composition consists only of the thermosetting resin (and the curing agent, the curing accelerator, the thermoplastic resin, and the additive contained therein if necessary). In this way, the deactivation of the active agent due to the reaction, which may occur if the thermosetting resin (to be specific, an epoxy resin or the like) and the active agent (to be specific, a carboxylic acid or the like) are present in the same layer (the thermosetting resin-containing layer), can be suppressed. And therefore, it becomes possible to perform an excellent solder melting by the active agent. A case where the thermosetting resin composition does not substantially contain the active agent is defined as follows: the content ratio of the active agent with respect to the thermosetting resin composition of, for example, 5 mass % or less, preferably below 1 mass %, or more preferably below 0.5 mass %. An example of the active agent includes the active agent described above in the solder layer.

In order to obtain the joining sheet, first, the solder layer and the thermosetting resin-containing layer are fabricated.

In order to fabricate the solder layer, first, for example, the above-described solder particles, thermoplastic resin, and active agent, and an additive contained as required, are kneaded with, for example, a kneader or the like, so that the solder composition is prepared as a kneaded product.

The kneading temperature is not particularly limited as long as it is below the melting point of the solder particles and not less than the softening temperature of the thermoplastic resin. To be specific, the kneading temperature is, for example, 80 to 135° C., or preferably 100 to 130° C.

Next, the kneaded product is molded into a sheet shape by, for example, a method such as a calender rolling, a press molding, or an extrusion molding. The molding temperature is, for example, 80 to 135° C., or preferably 100 to 130° C. In this way, the solder layer is formed.

The thickness of the solder layer is, for example, 10 to 200 μm, or preferably 20 to 100 μm. When the thickness is below the above-described range, the thickness of the solder layer is thinner than the average particle size of each of the solder particles, so that it may be difficult to process the solder layer into a sheet shape. On the other hand, when the thickness is above the above-described range, there may be a disadvantage in terms of cost.

In order to fabricate the thermosetting resin-containing layer, the above-described thermosetting resin, and the curing agent, the curing accelerator, the thermoplastic resin, and the additive, which are contained therein if necessary, are blended into, for example, a solvent (for example, an organic solvent such as methyl ethyl ketone and acetone), so that a varnish is prepared.

The mixing ratio of the solvent with respect to 100 parts by mass of the thermosetting resin is, for example, 10 to 1000 parts by mass.

Next, the varnish is applied to the surface of a substrate to be thereafter dried. The drying temperature is, for example, 80 to 135° C., or preferably 100 to 130° C.

The substrate is formed of, for example, a sheet of a synthetic resin such as polyester including polyethylene terephthalate. The surface of the substrate can be subjected to a release treatment as required.

In this way, the thermosetting resin composition is formed into a sheet shape to form the thermosetting resin-containing layer to be laminated on the substrate. Preferably, the thermosetting resin-containing layer in a sheet shape is in a B-stage state (a semi-cured state).

The thickness of the thermosetting resin-containing layer is, for example, 1 to 50 μm, or preferably 2 to 25 μm. When the thickness is below the above-described range, there may be a case where a sufficient effect in the reinforcement of the solder joining portion cannot be obtained. On the other hand, when the thickness is above the above-described range, a solder joining of the terminals by the solder melting may become insufficient.

Thereafter, the solder layer and the thermosetting resin-containing layer are laminated. To be specific, the solder layer and the thermosetting resin-containing layer are attached to each other. When the thermosetting resin-containing layer is formed on the surface of the substrate, the thermosetting resin-containing layer is attached to the solder layer so as to be in contact with each other. In this way, the joining sheet is obtained.

FIG. 1 shows process drawings for illustrating one embodiment of a method for producing an electronic component of the present invention: FIG. 1 (*a*) illustrating a step of preparing a joining sheet and wired circuit boards, FIG. 1 (*b*) illustrating a step of laminating the joining sheet and the wired circuit boards, FIG. 1 (*c*) illustrating a step of compressively bonding the joining sheet to the wired circuit boards, and FIG. 1 (*d*) illustrating a step of solder joining the joining sheet to the wired circuit boards.

Next, a method for producing an electronic component using the joining sheet as an electrically conductive joining sheet is described with reference to FIG. 1.

In this method, first, as shown in FIG. 1 (*a*), two pieces of wired circuit boards 2 and a joining sheet 5 are prepared.

Each of the wired circuit boards 2 is provided with a board 15 and a wired circuit which is provided on the surface of the board 15 and has terminals 1. The board 15 is formed into a flat plate shape and is formed of an insulating board or the like. A plurality of the terminals 1 are made of metal and are disposed at spaced intervals to each other.

The maximum length of each of the terminals 1 is, for example, 50 to 1000 μm. The gap between the terminals 1 is, for example, 50 to 1000 μm.

The joining sheet 5 includes a solder layer 3 and thermosetting resin-containing layers 4 which are laminated on both surfaces of the solder layer 3. In order to prepare the joining sheet 5, first, when the thermosetting resin-containing layers 4 are formed on the surfaces of substrates 20, two pieces of thermosetting resin-containing layers 4 which are formed on the surfaces of the substrates 20 are prepared and the solder layer 3 is prepared. Next, the solder layer 3 is sandwiched between the two pieces of thermosetting resin-containing layers 4, so that the joining sheet 5 having a three-layered structure is prepared.

Thereafter, as shown by arrows, the substrates 20 are peeled from the thermosetting resin-containing layers 4.

Next, as shown in FIG. 1 (*b*), the wired circuit boards 2 and the joining sheet 5 are laminated. That is, first, as shown in FIG. 1 (*a*), the two pieces of wired circuit boards 2 are disposed at spaced intervals to each other in the thickness direction (the up-down direction in FIG. 1). To be specific, the two pieces of wired circuit boards 2 are disposed in opposed relation to each other so that the terminals 1 of the upper-side wired circuit board 2 are disposed in opposed relation to those of the lower-side wired circuit board 2 in the thickness direction. Subsequently, the joining sheet 5 is interposed between the two pieces of wired circuit boards 2.

Next, as shown in FIG. 1 (*b*), the two pieces of wired circuit boards 2 are allowed to be closer to each other and the wired circuit boards 2 are brought into contact with the joining sheet 5. To be specific, surfaces 12 of the terminals 1 of the upper-side wired circuit board 2 are brought into contact with the surface of the upper-side thermosetting resin-containing layer 4 and the surfaces 12 of the terminals 1 of the lower-side wired circuit board 2 are brought into contact with the surface of the lower-side thermosetting resin-containing layer 4. In this way, a laminate 6 is obtained.

Next, as shown in FIG. 1 (c), if necessary, the joining sheet 5 is compressively bonded to the wired circuit boards 2. Preferably, the laminate 6 is subjected to a thermal compression bonding.

That is, the laminate 6 is heated at a temperature that is below the melting point of solder particles 9 and the two pieces of wired circuit boards 2 are pressed toward the joining sheet 5.

In this way, the thermosetting resin-containing layers 4 in the joining sheet 5 are melted or moved, so that the terminals 1 are embedded in the thermosetting resin-containing layers 4. That is, the surfaces 12 and side surfaces 13 of the terminals 1 are covered with the thermosetting resin-containing layers 4.

Along with this, a surface 14, which is an exposed portion from the terminals 1 on the board 15, is covered with the thermosetting resin-containing layers 4.

The temperature in the thermal compression bonding may be appropriately determined in accordance with the type of the thermosetting resin, the thermoplastic resin, or the like. The temperature is, for example, 100 to 140° C., or preferably 110 to 135° C. and the pressure is, for example, 0.05 to 10 MPa, or preferably 0.1 to 5 MPa.

Next, in this method, as shown in FIG. 1 (d), the laminate 6 is heated.

The heating temperature is a temperature that is not less than the melting point of the solder particles 9, that is, a temperature at which the solder particles 9 are melted by the presence of the active agent. The heating temperature may be appropriately determined in accordance with the type of the solder material, the active agent, or the like and to be specific, is, for example, 140 to 200° C., or preferably 150 to 180° C.

In this way, the two pieces of wired circuit boards 2 are joined by the joining sheet 5 and each of the terminals 1 corresponding to each of the wired circuit boards 2 is electrically connected to each other.

That is, the terminals 1 are solder joined in the thickness direction. To be specific, the solder particles 9 which are dispersed in the thermoplastic resin are melted by the activation of the active agent and aggregate (self-aggregate) between the terminals 1 which are opposed to each other in the thickness direction to form the solder joining portions 7 (portions made of the solder material). On the other hand, the thermosetting resin in the thermosetting resin-containing layers 4 is expelled by the self-aggregating solder particles 9 and moves around the solder joining portions 7. Thereafter, the expelled thermosetting resin is thermally cured, so that a cured layer 8 which reinforces the solder joining portions 7 is formed. Preferably, the cured layer 8 is in a C-stage state (a completely cured state).

Each of the solder joining portions 7 is formed into a generally column shape extending along the thickness direction and is formed so that the its cross-sectional area in a direction perpendicular to the thickness direction is gradually reduced from the center in the thickness direction of the joining sheet 5 toward the top side and the bottom side. One surfaces in the thickness direction (the top surfaces) of the solder joining portions 7 are in contact with the surfaces 12 of the upper-side terminals 1. The other surfaces in the thickness direction (the bottom surfaces) of the solder joining portions 7 are in contact with the surfaces 12 of the lower-side terminals 1.

The cured layer 8 is in contact with the side surfaces 13 of the terminals 1 and the surface 14, which is the exposed portion from the terminals 1 on the board 15, and is present around the solder joining portions 7.

In this way, an electronic component 11 is obtained.

The joining sheet 5 includes the solder layer 3 which contains the solder particles 9, the thermoplastic resin, and the active agent and the thermosetting resin-containing layers 4 which contain the thermosetting resin. That is, the active agent and the thermosetting resin are contained in separate layers (that is, each of the solder layer and the thermosetting resin-containing layers). Accordingly, the deactivation of the active agent due to the reaction of the active agent with the thermosetting resin can be suppressed before heating or during heating. Therefore, in the solder joining of the electronic component 11, the solder melting of the solder particles 9 is excellent, and the solder joining portions 7 made of the solder material can be surely formed.

After the solder joining, the solder joining portions 7 are reinforced by the cured layer 8 in which the thermosetting resin is cured, so that the joining strength of the electronic component 11 can be improved.

In the method for producing the electronic component 11, when the joining sheet 5 is heated, the solder particles 9 self-aggregate between the terminals 1 which are opposed to each other in the thickness direction to form the solder joining portions 7. Therefore, the terminals 1 can be easily solder joined without using a complicated printing technology. The electronic component 11 in which the terminals 1 are solder joined has an excellent reliability and an excellent joining strength due to an excellent formation of the solder joining portions 7.

In the embodiment of FIG. 1, in the lamination of the wired circuit boards 2 and the joining sheet 5, the joining sheet 5 is interposed between the two pieces of wired circuit boards 2. Alternatively, for example, though not shown, the joining sheet 5 is laminated on one wired circuit board 2 so that the thermosetting resin-containing layer 4 is brought into contact with the terminals 1 of the wired circuit board 2 and thereafter, the other wired circuit board 2 can be laminated on the joining sheet 5 so that the thermosetting resin-containing layer 4 and the terminals 1 are brought into contact with the joining sheet 5. That is, on one wired circuit board 2, the joining sheet 5 and the other wired circuit board 2 can be also sequentially laminated.

In the embodiment of FIG. 1 (a), the joining sheet 5 is described as a three-layered structure in which the thermosetting resin-containing layers 4 are laminated on one surface and the other surface in the thickness direction of the solder layer 3. Alternatively, for example, though not shown, the joining sheet 5 can be formed as a two-layered structure in which the thermosetting resin-containing layer 4 is laminated on one surface in the thickness direction of the solder layer 3 only. The two pieces of wired circuit boards 2 are laminated on both surfaces of the joining sheet having a two-layered structure to be heated at a temperature that is not less than the melting point of the solder particles, so that the electronic component 11 can be also obtained.

When the joining sheet having a two-layered structure is used, the electronic component 11 to be obtained can also have the same function and effect as that of the embodiment of FIG. 1.

EXAMPLES

While the present invention will be described hereinafter in further detail with reference to Examples and Comparative Examples, the present invention is not limited to these Examples and Comparative Examples.

Example 1

An acrylic resin (manufactured by KURARAY CO., LTD., LA polymer, a softening temperature of 110° C.) and solder particles (Sn/Bi=42 mass %/58 mass %, the melting point of 139° C., a sphere shape) each of which has an average particle size of 35 μm were mixed at a volume ratio of 50:50. Furthermore, 1 part by mass of an active agent (a 2-phenoxybenzoic acid) was added with respect to 100 parts by mass of the solder particles to be mixed at 125° C. with a kneader, so that a mixture (a solder composition) was obtained. The obtained mixture was molded into a sheet shape having a thickness of 50 μm at 125° C., so that a solder layer was fabricated.

On the other hand, an epoxy resin (manufactured by NIPPON STEEL CHEMICAL CO., LTD., a thermosetting resin, "YSLV-80XY", a curing temperature of 150° C.), a phenol resin (manufactured by MEIWA PLASTIC INDUSTRIES, LTD., a curing agent, "MEH-7851SS"), and an acrylic resin (manufactured by KURARAY CO., LTD., a thermoplastic resin, LA polymer, a softening temperature of 110° C.) were mixed at a volume ratio of 15:15:70. Furthermore, 5 parts by mass of 2-phenyl-4-methylimidazole (a curing accelerator) was mixed with respect to 100 parts by mass of the epoxy resin to be dissolved into methyl ethyl ketone, so that a varnish of a thermosetting resin composition was prepared. The prepared varnish was applied onto a PET film (with a release treatment already completed) to be dried, so that a thermosetting resin-containing layer (in a B-stage state) having a thickness of 10 μm was fabricated.

Two pieces of thermosetting resin-containing layers were laminated on both surfaces of the above-described solder layer, so that a joining sheet having a three-layered structure of the thermosetting resin-containing layer/the solder layer/the thermosetting resin-containing layer was obtained.

Example 2

A joining sheet was obtained in the same manner as in Example 1, except that the volume ratio in the thermosetting resin composition was changed as follows: the epoxy resin:the phenol resin:the acrylic resin=30:30:40.

Example 3

A joining sheet was obtained in the same manner as in Example 1, except that the volume ratio in the thermosetting resin composition was changed as follows: the epoxy resin:the phenol resin:the acrylic resin=45:45:10.

Example 4

A joining sheet was obtained in the same manner as in Example 1, except that the volume ratio in the solder composition was changed as follows: the solder particles:the acrylic resin=75:25.

Example 5

A joining sheet was obtained in the same manner as in Example 4, except that the volume ratio in the thermosetting resin composition was changed as follows: the epoxy resin:the phenol resin:the acrylic resin=30:30:40.

Example 6

A joining sheet was obtained in the same manner as in Example 4, except that the volume ratio in the thermosetting resin composition was changed as follows: the epoxy resin:the phenol resin:the acrylic resin=45:45:10.

Example 7

A joining sheet was obtained in the same manner as in Example 1, except that the volume ratio in the solder composition was changed as follows: the solder particles:the acrylic resin=80:20.

Example 8

A joining sheet was obtained in the same manner as in Example 7, except that the volume ratio in the thermosetting resin composition was changed as follows: the epoxy resin:the phenol resin:the acrylic resin=30:30:40.

Example 9

A joining sheet was obtained in the same manner as in Example 7, except that the volume ratio in the thermosetting resin composition was changed as follows: the epoxy resin:the phenol resin:the acrylic resin=45:45:10.

Comparative Example 1

A joining sheet was obtained in the same manner as in Example 2, except that in the preparation of the solder composition, the 2-phenoxybenzoic acid was not mixed and the volume ratio of the solder particles to the acrylic resin was changed as follows: the solder particles:the acrylic resin=60:40 and in the preparation of the thermosetting resin composition, 1 part by mass of the 2-phenoxybenzoic acid was further mixed with respect to 100 parts by mass of the total amount of the resins of the epoxy resin, the phenol resin, and the acrylic resin.

Comparative Example 2

The fabrication of a joining sheet was attempted by obtaining a mixture in the same manner as in Example 2, except that in the preparation of the solder composition, an epoxy resin (a thermosetting resin, YSLV-80XY) was mixed instead of the acrylic resin and the volume ratio thereof was changed as follows: the solder particles:the epoxy resin=40:60.

However, the solder layer was not capable of being molded into a sheet shape.

Comparative Example 3

A joining sheet was obtained in the same manner as in Example 2, except that in the fabrication of the solder layer, the 2-phenoxybenzoic acid was not mixed and the volume ratio of the solder particles to the acrylic resin was changed as follows: the solder particles:the acrylic resin=60:40 and in the fabrication of the thermosetting resin-containing layer, 1 part by mass of the 2-phenoxybenzoic acid was further mixed with respect to 100 parts by mass of the total amount of the resins of the epoxy resin, the phenol resin, and the acrylic resin and the volume ratio thereof was changed as follows: the epoxy resin:the phenol resin:the acrylic resin=10:10:80.

(Performance Test)
Molding of Sheet

In Examples 1 to 9 and Comparative Examples 1 to 3, in an attempt to fabricate a sheet, a case where the solder layer and the thermosetting resin-containing layer were capable of being molded into a sheet shape was evaluated as "Good" and a case where the solder layer and/or the thermosetting resin-containing layer were/was not capable of being molded into a sheet shape was evaluated as "Bad".

Solder Melting A

Using, as adherends, copper foils which were not subjected to an anti-corrosion treatment, the joining sheets in Examples 1 to 9, and Comparative Examples 1 and 3 were sandwiched from both sides between the two copper foils. The sandwiched product was subjected to a thermal compression bonding at 125° C. and 1 MPa and then, was heated at 160° C. for 30 minutes. In this way, the two copper foils were solder joined, so that a solder joined product was fabricated. Thereafter, the cross section of the obtained solder joined product was observed and the presence or absence of the solder melting was confirmed. The confirmation of the presence of the solder melting was evaluated as "Good". The confirmation of the absence of the solder melting was evaluated as "Bad".

Joining Strength A

A peeling test of the solder joined products in Examples 1 to 9, and Comparative Examples 1 and 3 fabricated in the evaluation of the solder melting was performed and the fracture mode of the joined products was confirmed. A case where the joining sheet was subjected to a cohesive fracture was considered to have an excellent joining strength and was evaluated as "Good". A case where the interface between the copper foil and the joining sheet was subjected to a fracture (an interfacial fracture) was evaluated as "Bad".

The results of the above-described tests are shown in the following Table 1 and Table 2.

TABLE 1

| | | | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|---|
| Solder Layer (Solder Composition) | Solder Particles (volume %) | Sn—Bi Alloy | 50 | 50 | 50 | 75 | 75 | 75 | 80 | 80 | 80 |
| | Thermoplastic Resin (volume %) | Acrylic Resin | 50 | 50 | 50 | 25 | 25 | 25 | 20 | 20 | 20 |
| | Active Agent (Parts by Mass to 100 Parts by Mass of Solder Particles) | 2-Phenoxybenzoic Acid | 1 | 1 | 1 | 1 | 1 | 1 | 1 | 1 | 1 |
| Thermosetting Resin-Containing Layer (Thermosetting Resin Composition) | Thermosetting Resin (volume %) | Epoxy Resin | 15 | 30 | 45 | 15 | 30 | 45 | 15 | 30 | 45 |
| | Curing Agent (volume %) | Phenol Resin | 15 | 30 | 45 | 15 | 30 | 45 | 15 | 30 | 45 |
| | Thermoplastic Resin (volume %) | Acrylic Resin | 70 | 40 | 10 | 70 | 40 | 10 | 70 | 40 | 10 |
| | Curing Accelerator (Parts by Mass to 100 Parts by Mass of Thermosetting Resin) | 2-Phenyl-Methyl Imidazole | 5 | 5 | 5 | 5 | 5 | 5 | 5 | 5 | 5 |
| | Active Agent (Parts by Mass to 100 Parts by Mass of Total Amount of Resin) | 2-Phenoxybenzoic Acid | — | — | — | — | — | — | — | — | — |
| Evaluation | Molding of Sheet | | Good | Good | Good | Good | Good | Good | Good | Good | Good |
| | Solder Melting | | Good | Good | Good | Good | Good | Good | Good | Good | Good |
| | Joining Strength | | Good | Good | Good | Good | Good | Good | Good | Good | Good |

TABLE 2

| | | | Comp. Ex. 1 | Comp. Ex. 2 | Comp. Ex. 3 |
|---|---|---|---|---|---|
| Solder Layer (Solder Composition) | Solder Particles (volume %) | Sn—Bi Alloy | 60 | 40 | 60 |
| | Thermoplastic Resin (volume %) | Acrylic Resin | 40 | — | 40 |
| | Thermosetting Resin (volume %) | Epoxy Resin | — | 60 | — |
| | Active Agent (Parts by Mass to 100 Parts by Mass of Solder Particles) | 2-Phenoxybenzoic Acid | — | 1 | — |
| Thermosetting Resin-Containing Layer (Thermosetting Resin Composition) | Thermosetting Resin (volume %) | Epoxy Resin | 30 | 30 | 10 |
| | Curing Agent (volume %) | Phenol Resin | 30 | 30 | 10 |
| | Thermoplastic Resin (volume %) | Acrylic Resin | 40 | 40 | 80 |
| | Curing Accelerator (Parts by Mass to 100 Parts by Mass of Thermosetting Resin) | 2-Phenyl-Methyl Imidazole | 5 | 5 | 5 |

TABLE 2-continued

|  |  |  | Comp. Ex. 1 | Comp. Ex. 2 | Comp. Ex. 3 |
| --- | --- | --- | --- | --- | --- |
|  | Active Agent (Parts by Mass to 100 Parts by Mass of Total Amount of Resin) | 2-Phenoxybenzoic Acid | 1 | — | 1 |
| Evaluation | Molding of Sheet | | Good | Bad | Good |
|  | Solder Melting | | Bad | | Bad |
|  | Joining Strength | | Bad | | Bad |

Example 10

Performance Test of Solder Melting B and Joining Strength B of Joining Sheet of Example 1

Two pieces of wired circuit boards each of which was provided with a board and a wired circuit formed on the surface of the board and having terminals (a gap between the terminals of 100 μm) made of copper were prepared (ref: FIG. 1 (a)). The two pieces of wired circuit boards were arranged so that corresponding terminals thereof were spaced in opposed relation to each other. Thereafter, the joining sheet of Example 1 was interposed between the two pieces of wired circuit boards so as to be brought into contact therewith, so that a laminate was obtained (ref: FIG. 1 (b)). Next, the obtained laminate was subjected to a thermal compression bonding at 125° C. and 1 MPa (ref: FIG. 1 (c)) to be then heated at 160° C. for 30 minutes, so that an electronic component was fabricated (ref: FIG. 1 (d)).

The solder melting of the electronic component was examined and the solder melting was confirmed. Also, when the peeling test thereof was performed, the joining strength thereof was excellent.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A joining sheet comprising:
a solder layer which contains solder particles, a thermoplastic resin, and an active agent capable of activating the solder particles, but does not substantially contain a thermosetting resin; and
a thermosetting resin-containing layer which is laminated on at least one surface in a thickness direction of the solder layer and contains a thermosetting resin.

2. The joining sheet according to claim 1, wherein
the thermosetting resin-containing layer further contains a thermoplastic resin and the content ratio of the thermosetting resin with respect to the thermosetting resin-containing layer is above 10 volume % and below 47.5 volume %.

3. The joining sheet according to claim 1, wherein
the content ratio of the solder particles with respect to the solder layer is above 40 volume % and below 90 volume %.

4. The joining sheet according to claim 1, wherein
the active agent is a carboxylic acid.

5. The joining sheet according to claim 1, wherein
the thermosetting resin contains an epoxy resin.

6. The joining sheet according to claim 1, wherein
the solder particles are made of a tin-bismuth alloy.

7. The joining sheet according to claim 1, wherein
the thermosetting resin-containing layer further contains a curing agent and a curing accelerator.

8. The joining sheet according to claim 1, wherein
the thermosetting resin-containing layer is also laminated on the other surface in the thickness direction of the solder layer.

9. A method for producing an electronic component comprising the steps of:
preparing a laminate in which a joining sheet is disposed between two pieces of wired circuit boards arranged so that corresponding terminals thereof are spaced in opposed relation to each other, wherein
the joining sheet comprises
a solder layer which contains solder particles, a thermoplastic resin, and an active agent capable of activating the solder particles, but does not substantially contain a thermosetting resin, and
a thermosetting resin-containing layer which is laminated on at least one surface in a thickness direction of the solder layer and contains a thermosetting resin; and
heating the laminate at a temperature that is not less than the melting point of the solder particles.

10. An electronic component obtained by a method for producing an electronic component, wherein
the method for producing an electronic component comprises the steps of:
preparing a laminate in which a joining sheet is disposed between two pieces of wired circuit boards arranged so that corresponding terminals thereof are spaced in opposed relation to each other, and
the joining sheet comprises
a solder layer which contains solder particles, a thermoplastic resin, and an active agent capable of activating the solder particles, but does not substantially contain a thermosetting resin, and
a thermosetting resin-containing layer which is laminated on at least one surface in a thickness direction of the solder layer and contains a thermosetting resin; and
heating the laminate at a temperature that is not less than the melting point of the solder particles.

* * * * *